United States Patent [19]

Hada et al.

[11] 4,359,648
[45] Nov. 16, 1982

[54] PULSE SIGNAL CONTROL CIRCUITS
[75] Inventors: Hiroshi Hada; Tsutomu Hirayama, both of Tokyo, Japan
[73] Assignee: Nippon Electric Co., Ltd., Japan
[21] Appl. No.: 943,730
[22] Filed: Sep. 19, 1978
[30] Foreign Application Priority Data
Sep. 21, 1977 [JP] Japan .................... 52-114208
[51] Int. Cl.³ .................................. H03K 17/60
[52] U.S. Cl. .................. 307/254; 307/231; 307/479; 307/540
[58] Field of Search ............ 307/230, 254, 210, 237
[56] References Cited
U.S. PATENT DOCUMENTS
3,381,144  4/1968  Thomas ..................... 307/254
3,896,317  7/1975  Alcorn et al. ................ 307/254
FOREIGN PATENT DOCUMENTS
2224608  11/1973  Fed. Rep. of Germany ...... 307/254
OTHER PUBLICATIONS
"Plasma Display Panel UTOVUE PH2008-03", by Nippon Electric Co. Limited, Jan. 30, 1975.

Primary Examiner—Stanley D. Miller, Jr.
Assistant Examiner—B. P. Davis
Attorney, Agent, or Firm—Charles W. Helzer

[57] ABSTRACT

A first diode having a polarity opposite to the diode characteristic between the emitter and base electrodes is connected across these electrodes of a first transistor, a resistor having a high resistance is connected between the collector and the base electrodes of the first transistor and a first source of high reference potential is connected to the collector electrode. The collector electrode of a second transistor is connected to the base electrode of the first transistor and to a second diode and the emitter electrode of the second transistor is connected to a second source of low reference potential. A high frequency pulse signal is applied to the collector electrode of the second transistor through the second diode, and a pulse data signal containing a high frequency pulse signal synchronous with the first mentioned high frequency pulse is applied to the base electrode of the second transistor thereby producing an amplified pulse data signal containing a high frequency pulse signal corresponding to a data input signal on the emitter electrode of the first transistor.

6 Claims, 12 Drawing Figures

FIG.3
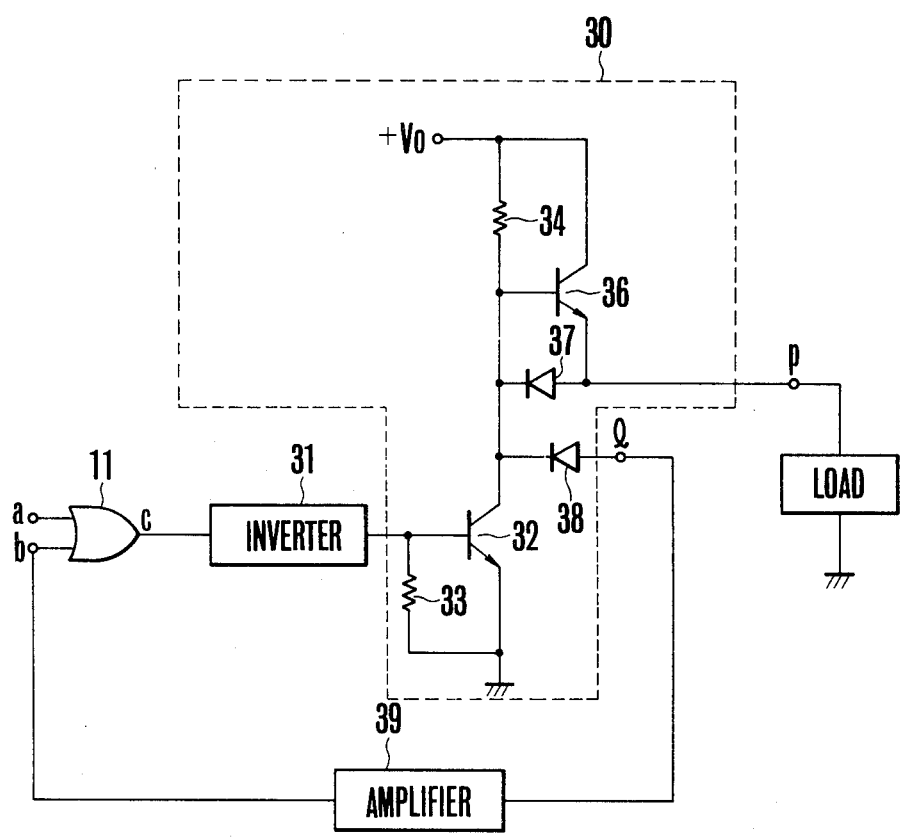
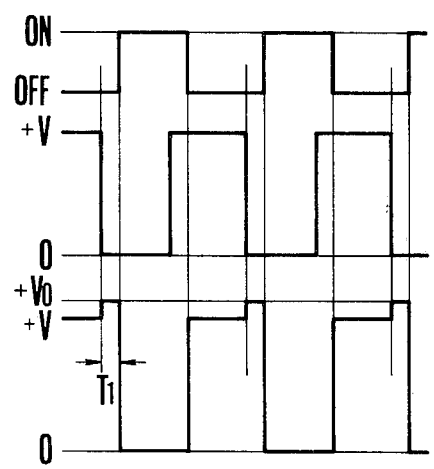
FIG.5A
FIG.5B
FIG.5C

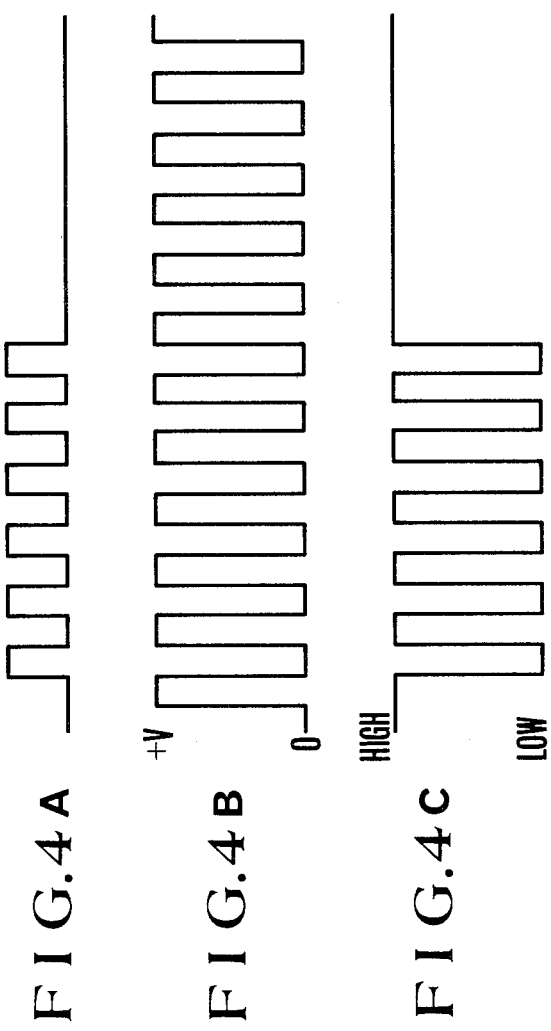

PULSE SIGNAL CONTROL CIRCUITS

BACKGROUND OF THE INVENTION

This invention relates to a pulse signal control circuit and more particularly a pulse signal control circuit for obtaining an amplified pulse data signal containing a high frequency pulse corresponding to a data signal, for use as a drive circuit of an AC plasma display unit, for example.

FIG. 1 shows a typical example of the prior art pulse signal control circuit 10, in which a data signal shown in FIG. 2A is supplied to one input a of a gate circuit 11 and a high frequency pulse signal as shown in FIG. 2B is applied to the other input b so as to produce an pulse data signal as shown in FIG. 2C on the output terminal c of the gate circuit 11. The pulse signal control circuit 10 further comprises an amplifier circuit 12 for amplifying the pulse data signal. The amplifier circuit 12 comprises a switching transistor 13, a buffer transistor 14, a resistor 15 connected across the base collector of transistor 13, a buffer diode 16 connected across the base and emitter electrodes of the transistor 14 with the opposite polarity, a speed-up capacitor 17 and a resistor 18 which is connected in parallel with capacitor 17, the capacitor 17 and the resistor 18 being connected between the output terminal c of the gate circuit 11 and the base electrode of the switching transistor 13.

The switching transistor 13 comprises an NPN type transistor with its emitter electrode grounded and its collector electrode connected to a source +V via resistor 15 which acts as a collector resistor for transistor 13. The buffer transistor 14 comprises an NPN type transistor with its collector electrode connected directly to the source +V whereas its base electrode is connected to the juncture of resistor 15 with collector electrode of the switching transistor 13.

When the pulse data signal shown in FIG. 2C appears on the output terminal c of the gate circuit 11, this pulse data signal is voltage-amplified by the switching transistor 13 and then current-amplified by the buffer transistor 14 thus producing an amplified data signal as shown by FIG. 2D as an output P. Such a pulse signal control circuit 10 as discussed above was described in a technical bulletin for "Plasma Display Panel UTOVUE PH 2008-03" published Jan. 30, 1975 by the assignee of the present application.

However, the pulse control circuit 10 described above has the following defects. Considering the output signal P of the amplifier circuit 12 although the switching-ON characteristic of transistor 13 is fast, that is its fall time characteristic is steep, its risetime characteristic is poor because the output builds up to the source voltage +V in accordance with a time constant determined by the collector capacitance and the collector resistance of the switching transistor 13 (see portions d shown in FIG. 2D).

As the collector capacitor is in the range of 10 to 50pF and the collector resistance is 100 to 500 KΩ under conventional operating conditions, the build up or rise time of the output signal P will be more than 1 μs, thus seriously affecting the high speed switching operation.

To increase the switching-OFF speed of the switching transistor 13, it is necessary to make the value of the collector resistor 15 to be quite small. However when this resistance value is decreased, a large current would flow when the switching transistor 13 is turned ON, thus not only increasing power loss but also possibly damaging the transistor.

Since the pulse signal control circuit 10 is provided for each discharge cell when it is applied to an AC plasma display unit, increase in the power loss greatly increases the overall power consumption of the system making it difficult to design a practical system.

SUMMARY OF THE INVENTION

Accordingly, it is an object of this invention to provide an improved pulse signal control circuit capable of reducing power loss while improving switching speed.

To accomplish this object, according to the invention, a preamplified high frequency pulse is normally applied to a switching circuit so as to interrupt or pass an amplified high frequency pulse in accordance with a data signal.

According to a preferred embodiment of this invention, there is provided a signal control circuit comprising first and second transistors, a first diode connected between the emitter and base electrodes of the first transistor, the first diode having a polarity opposite to the diode characteristic between the emitter and base electrodes, a resistor having a high resistance connected between the collector and base electrodes of the first transistor, a source of first reference potential connected to the collector electrode of the first transistor, means for connecting the collector electrode of the second transistor to the base electrode of the first transistor and to a second diode, a source of second reference potential connected to the emitter electrode of the second transistor, a source of high frequency signal connected to the collector electrode of the second transistor through the second diode, a source of a pulse data signal containing a high frequency pulse signal synchronous with the first mentioned high frequency pulse and connected to the base electrode of the second transistor thereby producing a pulse data signal containing a high frequency pulse signal corresponding to a data input signal on the emitter electrode of the first transistor.

According to a further preferred embodiment of this invention, there is provided a pulse signal control circuit comprising a source of first reference potential, a source of high frequency pulse signal with substantially same peak voltage as that of said first reference potential source, a first switching circuit having the pulse input terminal connected to said high frequency pulse signal source and the output terminal connected to a load, a source of second reference potential, and a second switching circuit connected between said pulse input terminal and said second reference potential source, a high frequency pulse signal received by said first switching circuit producing an output only when the pulse input terminal is isolated from the second reference potential by means of said second switching circuit.

BRIEF DESCRIPTION OF THE DRAWINGS

In the accompanying drawings:

FIG. 3 is a connection diagram showing one embodiment of the pulse signal control circuit according to the invention;

FIGS. 4A, 4B and 4C show waveforms useful to explain the operation of the pulse signal control circuit shown in FIG. 3; and FIGS. 5A, 5B and 5C show waveforms useful to explain the modified operation of the pulse signal control circuit.

DESCRIPTION OF THE PREFERRED EMBODIMENT

Figure 1:
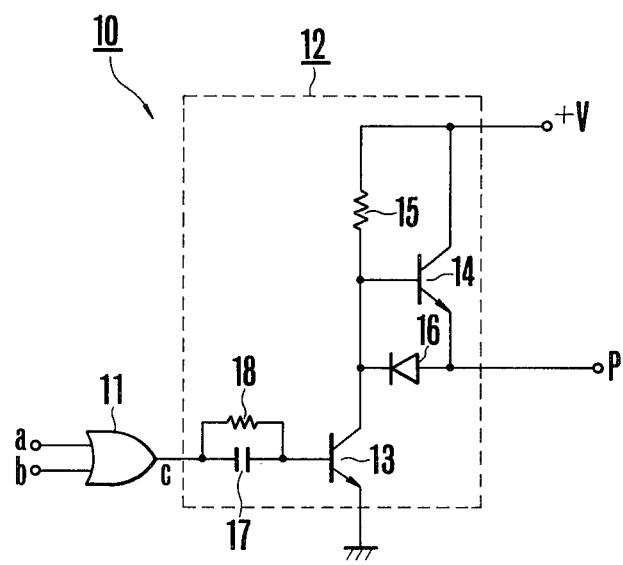
FIG. 1 is a connection diagram showing one example of a prior art pulse signal control circuit.
Figure 2A:
FIGS. 2A through 2D show waveforms useful to explain the operation of the pulse signal control circuit shown in FIG. 1.
Figure 2B:
Figure 2C:
Figure 2D:
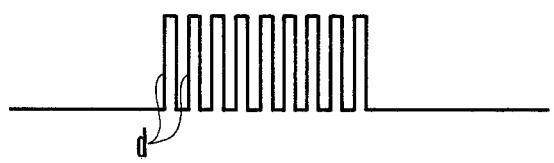

In a preferred embodiment of this invention shown in FIG. 3, circuit elements identical to those shown in FIG. 1 are designated by the same reference numerals. The element characterizing the invention comprises an amplifier circuit 30 bounded by dotted lines. The gate circuit 11 has the same construction as that shown in FIG. 1. The output terminal c of the gate circuit 11 is connected to the base electrode of a switching transistor 32 via an inverter 31. A base resistor 33 is connected between the base and emitter electrodes of the switching transistor 32 and the emitter electrode thereof is connected to a point of fixed potential such as the ground. The collector electrode of the switching transistor 32 is connected to a source $+V_0$ through a high resistance collector resistor 34 having a resistance of one mega-ohms (1 M$\Omega$), for example. The collector electrode of the switching transistor 32 is also connected to the base electrode of a buffer transistor 36. Across the base and emitter electrodes of transistor 36 is connected a first diode 37 having a polarity opposite to that of the PN diode characteristic of the emitter and base electrodes. The first diode 37 operates to make the emitter potential of transistor 36 higher than its base potential when the switching transistor 32 is turned ON thus preventing its damage and to form a feedback loop from a load. The collector electrode of transistor 36 is connected directly to the source $+V_0$ whereas the emitter electrode is connected to an output terminal P leading to the load. The cathode electrode of a second diode 38 is connected to the collector electrode of the switching transistor 32 whereas the anode electrode of the second diode 38 is connected to a terminal 1, which is supplied with a high frequency pulse. This high frequency pulse is formed by amplifying by a pulse amplifier 39 the high frequency pulse applied to the input terminal b of the gate circuit 11. The high frequency pulse may have a frequency of 200 to 500 KHz, for example.

The operation of the circuit shown in FIG. 3 will now be described with reference to FIG. 4. It is assumed that the high frequency pulse is supplied to the input terminal b of the gate circuit 11, that an amplified high frequency pulse shown in FIG. 4B is supplied to the collector electrode of the switching transistor 32 via terminal 1 and the second diode 38 and that a pulse data signal is applied to the base electrode of transistor 32 under these conditions.

Where no data signal is contained in the pulse data signal, that is where data is not applied to the input terminal a of the gate circuit 11, the output of the gate circuit becomes a high level. Accordingly, the output of inverter 31 becomes a low level thereby turning OFF switching transistor 32. As a consequence, the collector electrode of transistor 32 will be maintained at the positive crest value $+V$ of the amplified high frequency pulse which is applied to the base electrode of transistor 36 through diode 38. When the high frequency pulse changes from the high to low level, the base electrode of the transistor 36 is maintained at a high level with respect to the high frequency pulse since the diode 38 is reverse biased and the other circuit connected to the base electrode of transistor 32 is isolated from the base electrode of transistor 36. Accordingly, transistor 36 is maintained conductive until the next high level is supplied, whereby an output having a voltage of approximately $+V$ is continuously supplied to the output terminal P.

On the other hand, upon the occurrence of a pulse data signal containing data, the switching transistor 32 is repeatedly turned ON and OFF depending upon the nature of the data pulse. Thus, when transistor 32 is ON, the emitter potential of transistor 36 is clamped to ground potential via diode 37, and the emitter-collector path of transistor 32 in the conducting state, whereas when the transistor 32 is OFF, the emitter potential of 32 is fixed to the positive crest value $+V$ for the reason explained above. In addition the amplified high frequency pulse is applied through the base electrode of transistor 36 and the second diode 38. Thus, an amplified pulse data signal shown in FIG. 4C is produced by the emitter electrode of transistor 36 corresponding to the pulse data signal applied to the base electrode of the switching transistor 32.

As above described, when the transistor 32 is OFF, since the potential of the emitter electrode of transistor 36 is fixed to the positive crest value $+V$ of the high frequency pulse via the base electrode of transistor 36 and the second diode 38, the amplified pulse signal data which is supplied to the load via the output terminal P builds up very rapidly without any time lag. The rise time is principally dominated by the characteristics of the amplifier 39 whereas the fall time is determined primarily by the switching-on characteristic of the transistor 32. Thus output pulses having both rise and fall times less than 0.2 $\mu$s are provided with ease. Moreover since the collector resistor 34 is set to a high value, and since the build up characteristic of the amplified pulse data signal is excellent, the power loss of the circuit is reduced in comparison to the prior art circuit of FIG. 1.

The amplified high frequency pulse supplied to the collector electrode of transistor 32 is interrupted by the second diode 38 when the polarity of the high frequency pulse is negative, whereas when the polarity is positive the high frequency pulse is current-amplified by transistor 36 to produce a large output on its emitter electrode. For this reason, the high frequency pulse to be amplified may be very small.

Although in the foregoing embodiment NPN type transistors 32 and 36 were used they may be PNP type in which event the first and second diodes 37 and 38 are poled oppositely.

Furthermore, in the foregoing embodiment, the high frequency pulse applied to terminal 1 and the high frequency pulse applied to the input b of the gate circuit 11 were made to be synchronous and in phase as shown in FIG. 4A and 4B, the two pulses may have slightly different phases so as to prevent transistor 32 from becoming ON when the data signal is present and the high frequency pulse supplied to the terminal 1 is at a high level. By this arrangement, it is possible to prevent increases in power loss when the data signal is applied.

In the embodiment as indicated above, the signal supplied to the terminal b of the gate circuit is utilized as a high frequency pulse which is transmitted to the terminal 1 as it is. Accordingly, the phase of the signals is kept unchanged. In this state, however, ON or OFF state is instantly produced in both transistors 32 and 36, whereby build up or rise time and fall time of the output signal from the amplifier circuit 30 is being delayed. Accordingly, in order to avoid such unwanted state, it is preferable to provide pulses supplied to terminals b and 1 with a time lag to the extent of several 10ths of a micro second so as to prevent transistors 32 and 36 from being in an identical state at the same time. FIG. 5A shows the ON-OFF state of the transistor 32 while FIG. 5B shows the waveform of high frequency signal supplied to the terminal 1. With combination of waveforms like this, an output waveform as shown in FIG. 5C appears at the terminal P. As is apparent from the waveform, when the high frequency signal to the terminal 1 is in zero level, the transistor 32 is kept in OFF-state during the time $T_1$ and at the same time the source voltage $+V_0$ appears at the terminal P. Then, the peak voltage $+V$ to the terminal 1 being kept equal to said voltage $+V_0$, the voltage peak is eliminated at the section $T_1$ of FIG. 5C. This is a preferred operating mode.

What is claimed is:

1. A pulse signal control circuit comprising first and second transistors, a first diode connected between the emitter and base electrodes of said first transistor, said first diode having a polarity opposite to the diode characteristic between said emitter and base electrodes, a resistor having a high resistance connected between the collector and base electrodes of said first transistor, a source of first reference potential connected to the collector electrode of said first transistor, means for connecting the collector electrode of said second transistor to the base electrode of said first transistor and to a second diode, a second source of second reference potential connected to the emitter electrode of said second transistor, a source of high frequency pulse signal connected to the collector electrode of said second transistor through said second diode, a source of a pulse data signal containing a high frequency pulse signal synchronous with said first mentioned high frequency pulse signal and connected to the base electrode of said second transistor for producing an amplified output pulse data signal containing a high frequency pulse signal corresponding to the data input signal on the emitter electrode of said first transistor.

2. A pulse signal control circuit according to claim 1 which further comprises a logic gate circuit having a first input terminal supplied with a data signal and a second input terminal supplied with a high frequency pulse signal thereby producing said pulse data signal.

3. A pulse signal control circuit according to claim 2 wherein said high frequency pulse signal supplied to the collector electrode of said second transistor is obtained by amplifying the high frequency pulse signal supplied to said second input terminal of said logic gate circuit.

4. A pulse signal control circuit according to claim 1 wherein the high frequency pulses contained in said pulse data signal and the high frequency pulses supplied to the collector electrode of said second transistor through said second diode have different phases thereby preventing said second transistor from being turned ON when said last mentioned high frequency pulses are at a high level.

5. A pulse signal control circuit comprising a source of first reference potential; a source of second reference potential; a source of high frequency pulse signals having substantially the same peak voltage as that of said first reference potential; a source of pulse data signals containing high frequency pulse signals synchronous with said first mentioned high frequency pulse signals; a first switching circuit connected between said first reference potential source and a pulse input terminal for said first switching circuit and connected to a load through an output terminal of said switching circuit, said pulse input terminal being supplied with said high frequency pulse signals from said high frequency pulse signal source; a second switching circuit connected between said pulse input terminal and said second reference potential source and connected to said source of pulse data signals, a logic gate circuit having a first input terminal supplied with a data signal and a second input terminal supplied with a high frequency pulse signal for producing at the output of said logic gate circuit the pulse data signals for supply to the second switching circuit and wherein said high frequency pulse signals supplied to said pulse input terminal for said first switching circuits are obtained by amplifying the high frequency pulse signals supplied to the second input terminal of said logic gate circuit, whereby said first switching circuit supplies said first high frequency pulse signal as an amplified pulse data output signal to said load only when said second switching circuit receives said pulse data input signal, thereby isolating said pulse input terminal from said second reference potential source and providing high speed switching action for said control circuit while minimizing power consumption.

6. A pulse signal control circuit according to claim 5 wherein the high frequency pulses contained in the pulse data signal and the high frequency pulses supplied to said pulse input terminal for said first switching circuit have slightly different phases thereby preventing said second switching circuit from being turned ON when said high frequency pulses supplied to said pulse input terminal are at a high level.

* * * * *